(12) United States Patent
Lim

(10) Patent No.: US 7,160,778 B2
(45) Date of Patent: Jan. 9, 2007

(54) SEMICONDUCTOR DEVICE AND METHOD OF MANUFACTURING THE SAME

(75) Inventor: Tae-Hong Lim, Incheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/314,135

(22) Filed: Dec. 21, 2005

(65) Prior Publication Data

US 2006/0157715 A1    Jul. 20, 2006

(30) Foreign Application Priority Data

Dec. 22, 2004    (KR)    ...................... 10-2004-0110627

(51) Int. Cl.
*H01L 21/336* (2006.01)
(52) U.S. Cl. ...................... 438/268; 438/270
(58) Field of Classification Search ................ 438/268, 438/270
See application file for complete search history.

(56) References Cited

U.S. PATENT DOCUMENTS

2002/0109176 A1    8/2002    Forbes et al.

2004/0113207 A1    6/2004    Hsu et al.

FOREIGN PATENT DOCUMENTS

KR    10-2003-0088432    11/2003
KR    10-2004-0051506    6/2004

*Primary Examiner*—Jack Chen
(74) *Attorney, Agent, or Firm*—Andrew D. Fortney

(57) ABSTRACT

A semiconductor device having a vertical gate and method of manufacturing the same are disclosed. An example semiconductor device includes a pair of first source/drain regions formed apart from each other by a predetermined distance on a silicon substrate, a first silicon epitaxial layer formed on the pair of first source/drain regions, a vertical gate insulation layer formed at both sidewalls of the first silicon epitaxial layer, and a second silicon epitaxial layers formed on the first silicon epitaxial layer and on the gate insulation layer. The example device includes a pair of second source/drain regions formed in the second silicon epitaxial layer formed on the first silicon epitaxial layer, at positions above the pair of first source/drain regions, and a plurality of vertical gates respectively connected to the second silicon epitaxial layer formed on the gate insulation layer and to the pair of second source/drain regions.

4 Claims, 5 Drawing Sheets

SEMICONDUCTOR DEVICE AND METHOD OF MANUFACTURING THE SAME

RELATED APPLICATION

This application claims the benefit of Korean Application No. 10-2004-0110627 filed in the Korean Intellectual Property Office on Dec. 22, 2004, the entire contents of which are incorporated herein by reference.

TECHNICAL FIELD

The present disclosure relates to a semiconductor device and, more particularly, to a semiconductor device having a vertical gate and method of manufacturing the same.

BACKGROUND

Generally, a semiconductor device (e.g., a metal oxide semiconductor (MOS) transistor) includes source/drain regions in a silicon substrate. A gate insulation layer is formed on the silicon substrate between the source/drain regions. A gate is formed on the gate insulation layer. Accordingly, when an electric field is applied to the gate, carriers move through a channel formed in the silicon substrate under the gate insulation layer and thereby enable the semiconductor device to be turned on and off.

According to a known semiconductor device, such a gate is typically formed to be planar. When the gate is planarly formed, it may act as a limitation on higher integration of semiconductor devices. That is, when semiconductor devices are designed only planarly, integration may be limited due to the limited available area.

The above information disclosed in this Background section is only for enhancement of understanding of the background of the invention and therefore it may contain information that does not form the prior art that is already known in this country to a person of ordinary skill in the art.

DETAILED DESCRIPTION

Figure 1:
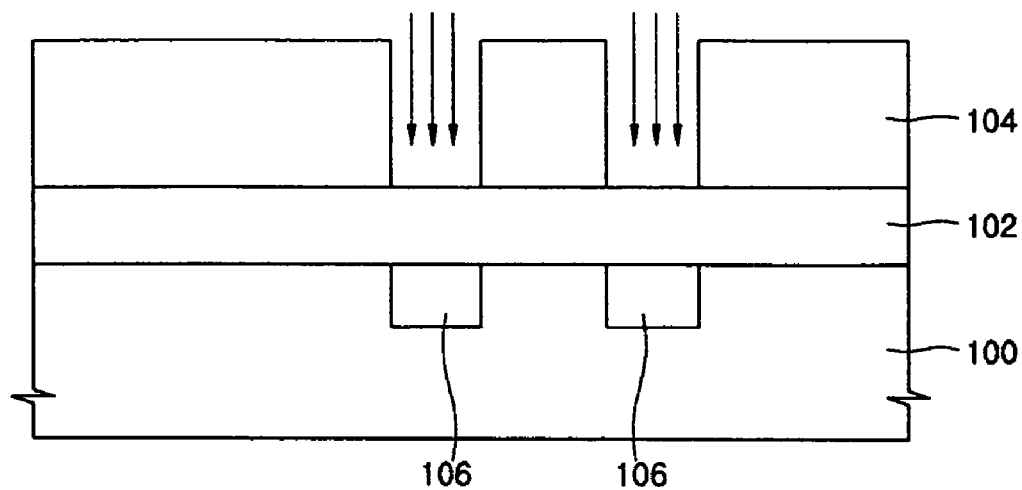
FIGS. 1 to 9 are cross-sectional views showing sequential stages of a method of manufacturing a semiconductor device having a vertical gate according to an example embodiment.

In general, the example method described herein provides a semiconductor device having a vertical gate as opposed to a typical horizontal gate and a method of manufacturing the same.

An example semiconductor device includes: a pair of first source/drain regions formed apart from each other by a predetermined distance on a silicon substrate; a first silicon epitaxial layer formed on the pair of first source/drain regions; a vertical gate insulation layer formed at both sidewalls of the first silicon epitaxial layer; second silicon epitaxial layers formed on the first silicon epitaxial layer and on the gate insulation layer; a pair of second source/drain regions formed in the second silicon epitaxial layer formed on the first silicon epitaxial layer, at positions above the pair of first source/drain regions; and a plurality of vertical gates respectively connected to the second silicon epitaxial layer formed on the gate insulation layer and to the pair of second source/drain regions.

The second silicon epitaxial layer may be formed on the first silicon epitaxial layer may be used as an electrode, and the gate insulation layer may also be formed on the silicon substrate at a position under the second silicon epitaxial layer under the gate. The gate insulation layer may be formed of silicon oxide.

In addition, according to an example method of manufacturing a semiconductor device, a pair of first source/drain regions are formed to be apart from each other on a silicon substrate, and then a buffer oxide layer having a vertical transistor forming region exposing the pair of first source/drain regions is formed. Then, after forming a first silicon epitaxial layer in the vertical transistor forming region, the buffer oxide layer is etched so as to form a vertical gate forming region at a position laterally exterior to the pair of first source/drain regions.

Then, after forming a vertical gate insulation layer in the vertical gate forming region, a second silicon epitaxial layer is formed in the vertical gate forming region and on the first silicon epitaxial layer, respectively. A pair of second source/drain regions are then formed, at positions above the pair of first source/drain regions, in the second silicon epitaxial layer formed on the first silicon epitaxial layer. A plurality of vertical gates are then formed such that they are respectively connected to the second silicon epitaxial layer formed on the gate insulation layer and to the pair of second source/drain regions. The gate insulation layer is formed by oxidation of a sidewall of the first silicon epitaxial layer and the second silicon epitaxial layer formed on the first silicon epitaxial layer may be formed of polysilicon to be used as an electrode. The gate insulation layer may also be formed on the silicon substrate under the second silicon epitaxial layer under the gate by oxidation of a surface of the silicon substrate.

To clarify multiple layers and regions, the thicknesses of the layers are enlarged in the drawings. Like reference numerals designate like elements throughout the specification.

When it is said that any part, such as a layer, film, area, or plate, is positioned on another part, it means the part is directly on the other part or above the other part with at least one intermediate part. In addition, if any part is said to be positioned directly on another part it means that there is no intermediate part between the two parts.

Figure 9:
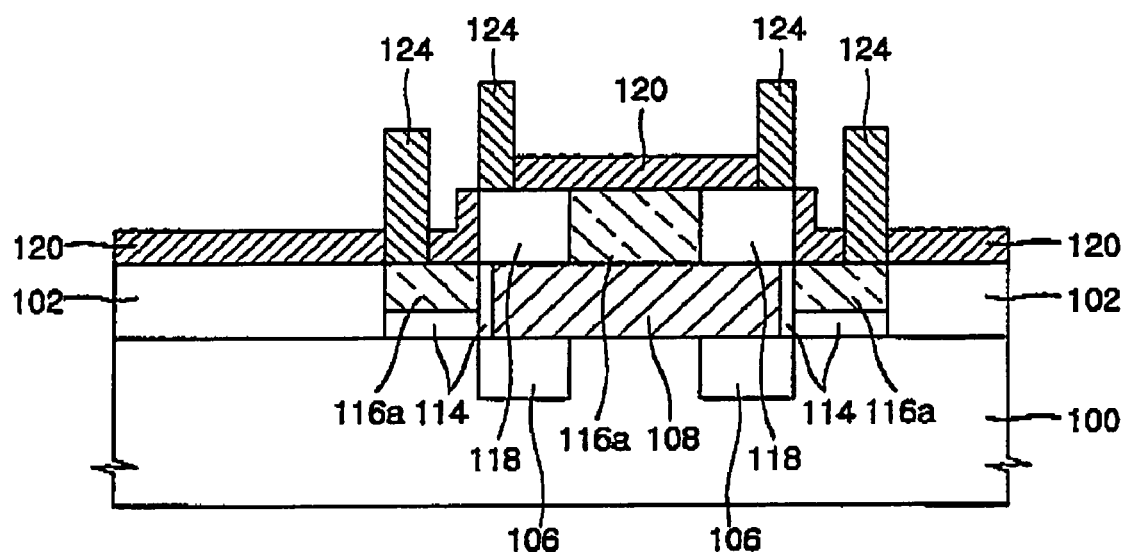

Now turning in detail to the figures, a semiconductor device having a vertical gate according to an example will be described in detail with reference to FIG. 9. Referring to FIG. 9, a pair of first source/drain regions 106 are formed apart from each other by a predetermined distance in a silicon substrate 100. A first silicon epitaxial layer 108 is formed on the pair of first source/drain regions 106.

A vertical gate insulation layer 114 is respectively formed at both sidewalls of the first silicon epitaxial layer 108. The gate insulation layer 114 is horizontally elongated on the silicon substrate 100. The gate insulation layer 114 is formed of silicon oxide. Second silicon epitaxial layers 116a are respectively formed on the first silicon epitaxial layer 108 and on the gate insulation layer 114. The second silicon epitaxial layer 116a formed on the first silicon epitaxial layer 108 may be used as an electrode.

Above the first source/drain regions 106, a pair of second source/drain regions 118 are formed near both ends of the second silicon epitaxial layer 116a formed on the first silicon epitaxial layer 108. A vertical gate 124 is connectedly formed on the second source/drain regions 118 and on the second silicon epitaxial layer 116a formed on the gate insulation layer 114, respectively. As described above, the gate insulation layer 114 is horizontally elongated on the silicon substrate 100 under the second silicon epitaxial layer 116a under the gate 124. The gate 124 is formed as a silicide. Because such a gate 124 (and also the vertical gate insulation layer 114) is formed in a generally vertical shape, the integration capacity of semiconductor devices may be enhanced by employing such a structure.

FIG. 1 to FIG. 9 are cross-sectional views showing sequential stages of a method of manufacturing the example semiconductor device having a vertical gate. Referring to FIG. 1, a buffer oxide layer 102 is formed on the silicon substrate 100. Then, a mask pattern 104 partially exposing the buffer oxide layer 102 is formed thereon. Subsequently, the first source/drain regions 106 are formed apart from each other by a predetermined distance by ion implantation of source/drain impurities into the silicon substrate 100 with the use of the mask pattern 104 as an ion implantation mask. When the silicon substrate 100 is a p-type silicon substrate, an n-type impurity, for example, arsenic (As) or phosphorus (P), may be used as the source/drain impurity. When the silicon substrate 100 is an n-type silicon substrate, a p-type impurity, for example, boron (B) may be used as the source/drain impurity.

Figure 2:
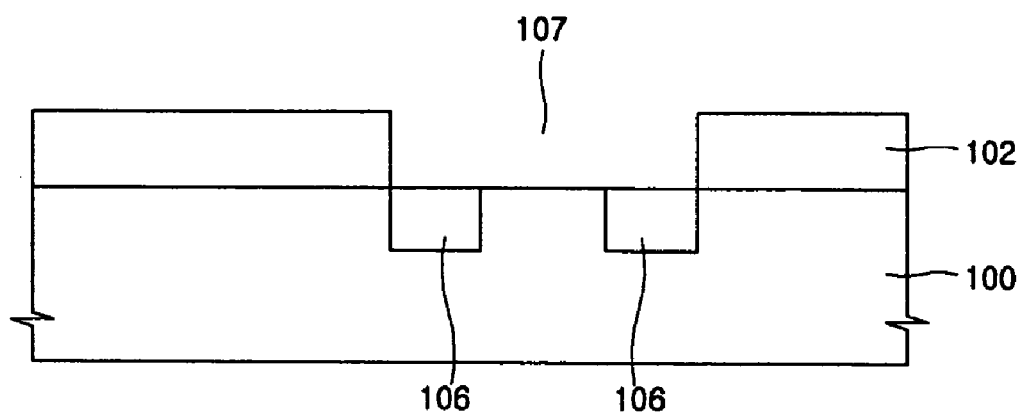

Now, referring to FIG. 2, the mask pattern 104 is removed. Then, a vertical transistor forming region 107 is formed by etching the buffer oxide layer 102 on the first source/drain regions 106. Therefore, the vertical transistor forming region 107 is formed to expose the first source/drain regions 106.

Figure 3:
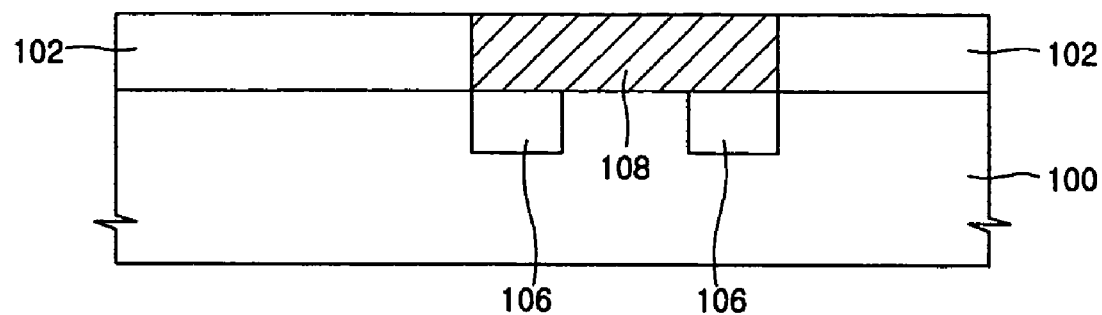

Referring to FIG. 3, the vertical transistor forming region 107 is filled with the first silicon epitaxial layer 108. The first silicon epitaxial layer 108 may be formed by firstly forming a silicon epitaxial layer on the entire substrate 100 and then performing chemical mechanical polishing.

Figure 4:
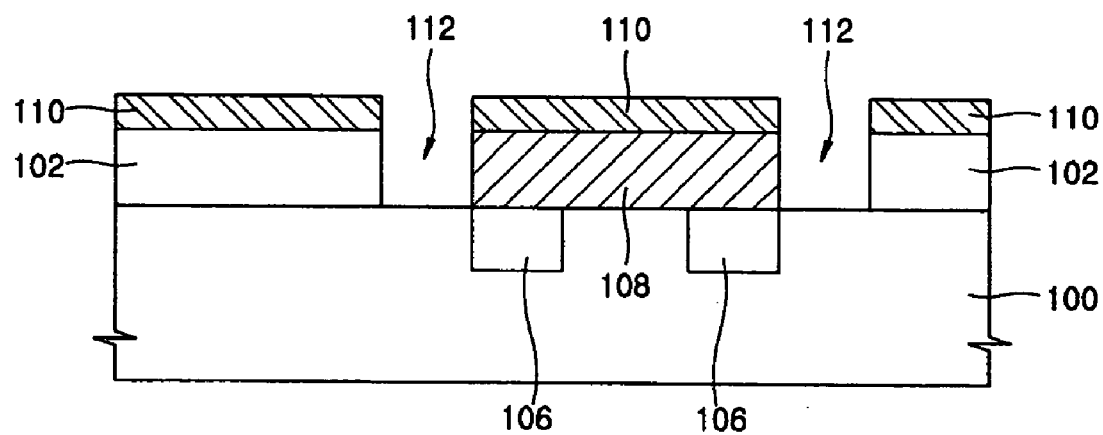

Referring to FIG. 4, a first insulation layer 110 is formed on the first silicon epitaxial layer 108 such that the first silicon epitaxial layer 108 may be protected thereby. The first insulation layer 110 is formed of silicon nitride. In addition, the first insulation layer 110 and the buffer oxide layer 102 are patterned such that vertical gate forming regions 112 are prepared at positions laterally exterior to the pair of first source/drain regions 106.

Figure 5:
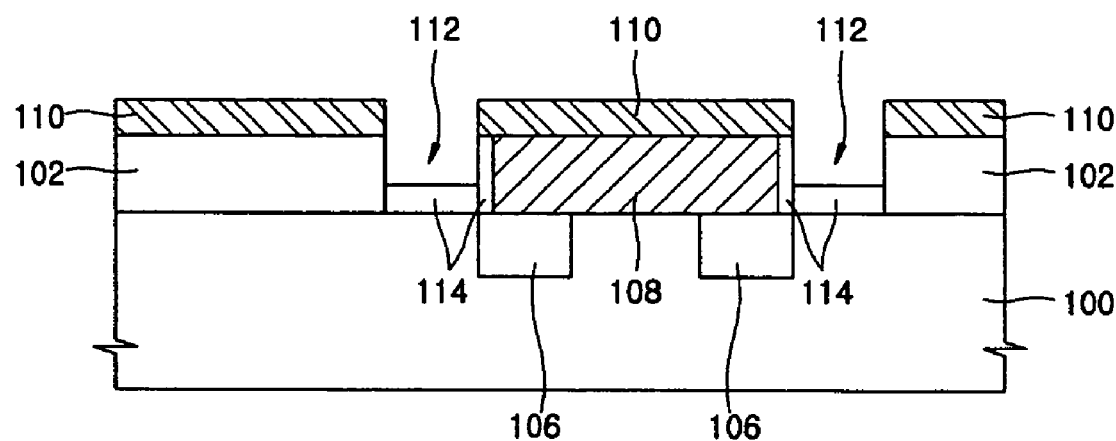

Referring to FIG. 5, the gate insulation layers 114 are formed in the gate forming regions 112. The gate insulation layers 114 are formed on the silicon substrate 100 and at both sidewalls of the first silicon epitaxial layer 108. That is, the gate insulation layers 114 are vertically formed at both sidewalls of the first silicon epitaxial layer 108. The gate insulation layers 114 are formed by oxidation of a surface of the silicon substrate 100 and both sidewalls of the first silicon epitaxial layer 108. The gate insulation layers 114 are formed of silicon oxide.

Figure 6:
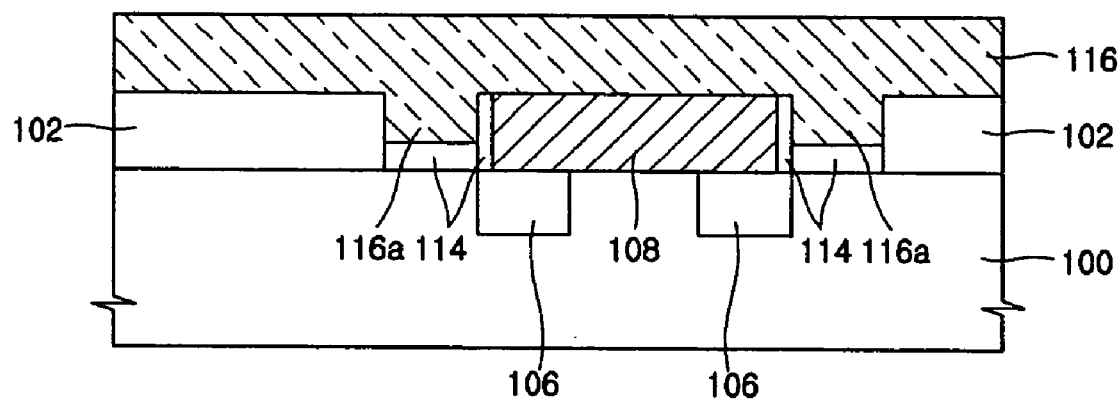

Referring to FIG. 6, the first insulation layer 110 on the first silicon epitaxial layer 108 and the buffer oxide layer 102 is removed. Subsequently, an upper silicon epitaxial layer 116 is formed on the vertical gate forming region 112, the first silicon epitaxial layer 108, and the buffer oxide layer 102. The upper silicon epitaxial layer 116 fills the gate forming region 112 that is formed in the shape of a hole.

Figure 7:
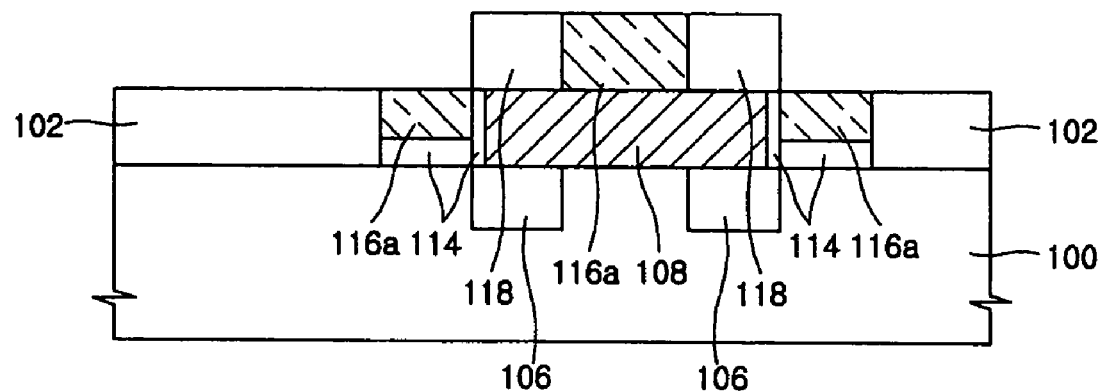

Referring to FIG. 7, a pair of second source/drain regions 118 are formed by ion implantation of impurities into the upper silicon epitaxial layer 116 at positions vertically above the first source/drain regions 106. In addition, the second silicon epitaxial layers 116a are formed by etching the upper silicon epitaxial layer 116 exterior to the second source/drain regions 118 but leaving the upper silicon epitaxial layer 116 within the vertical gate forming regions 112. Thus the second silicon epitaxial layers 116a remain on the first silicon epitaxial layer 108 and within the gate forming regions 112 above the gate insulation layers 114. The second silicon epitaxial layers 116a may be formed of polysilicon, and may be used as electrodes.

Figure 8:
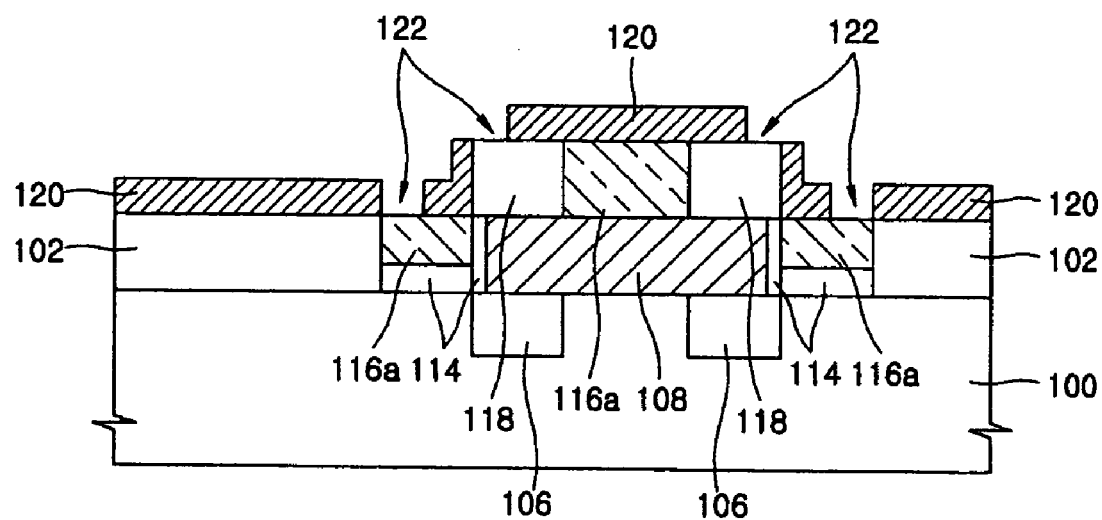

Referring to FIG. 8, a second insulation layer 120 having open regions 122 therein is formed such that the second silicon epitaxial layers 116a in the vertical gate forming regions 112 as well as the second source/drain regions 118 are partly exposed at the open regions 122. The second insulation layer 120 is formed of silicon nitride.

Now referring to FIG. 9, the gate 124 is respectively formed at the open regions 122. The gate 124 is formed as a silicide. Because such a gate 124 (and also the vertical gate insulation layer 114) is formed in a generally vertical shape, integration capacity of semiconductor devices may be enhanced.

As described above in connection with the example embodiment, integration capacity of semiconductor devices may be enhanced because a gate (and also a vertical gate insulation layer) is formed in a generally vertical shape.

While the examples herein have been described in detail with reference to example embodiments, it is to be understood that the coverage of this patent is not limited to the disclosed embodiments, but, on the contrary, is intended to cover various modifications and equivalent arrangements included within the spirit and scope of the appended claims.

What is claimed is:

1. A method of manufacturing a semiconductor device, comprising:

forming a pair of first source/drain regions apart from each other on a silicon substrate;

forming a buffer oxide layer having a vertical transistor forming region exposing the pair of first source/drain regions;

forming a first silicon epitaxial layer in the vertical transistor forming region;

etching the buffer oxide layer so as to form a vertical gate forming region at a position laterally exterior to the pair of first source/drain regions;

forming a vertical gate insulation layer in the vertical gate forming region;

forming a second silicon epitaxial layer respectively in the vertical gate forming region and on the first silicon epitaxial layer;

forming a pair of second source/drain regions, at positions above the pair of first source/drain regions, in the second silicon epitaxial layer formed on the first silicon epitaxial layer; and forming a plurality of vertical gates respectively connected to the second silicon epitaxial layer formed on the gate insulation layer and to the pair of second source/drain regions.

2. The method of claim 1, wherein the gate insulation layer is formed by oxidation of a sidewall of the first silicon epitaxial layer.

3. The method of claim 1, wherein the second silicon epitaxial layer formed on the first silicon epitaxial layer is formed of polysilicon so as to be used as an electrode.

4. The method of claim 1, wherein the gate insulation layer is also formed on the silicon substrate under the second silicon epitaxial layer under the gate, by oxidation of a surface of the silicon substrate.

* * * * *